United States Patent
Takagi

(10) Patent No.: US 9,576,737 B2
(45) Date of Patent: Feb. 21, 2017

(54) PARALLEL CAPACITOR AND HIGH FREQUENCY SEMICONDUCTOR DEVICE

(71) Applicant: Kabushiki Kaisha Toshiba, Minato-ku (JP)

(72) Inventor: Kazutaka Takagi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 139 days.

(21) Appl. No.: 14/632,383

(22) Filed: Feb. 26, 2015

(65) Prior Publication Data

US 2015/0294794 A1  Oct. 15, 2015

(30) Foreign Application Priority Data

Apr. 14, 2014  (JP) .................................. 2014-082787

(51) Int. Cl.
  *H01G 5/16* (2006.01)
  *H01G 4/38* (2006.01)
  (Continued)

(52) U.S. Cl.
  CPC .............. *H01G 4/385* (2013.01); *H01L 23/66* (2013.01); *H01L 27/0805* (2013.01);
  (Continued)

(58) Field of Classification Search
  CPC ............ H01G 5/01; H01G 5/013; H01G 5/16; H01G 5/38; H01G 5/40
  See application file for complete search history.

(56) References Cited

U.S. PATENT DOCUMENTS 5,322,438 A  6/1994  McNutt et al.
5,635,421 A  6/1997  Ting
(Continued)

FOREIGN PATENT DOCUMENTS

EP  1 359 607 A2  11/2003
JP  4-167703  6/1992
(Continued)

OTHER PUBLICATIONS

Extended European Search Report issued on Sep. 21, 2015 in European Patent Application No. 15157027-2.
(Continued)

*Primary Examiner* — Nguyen Ha
(74) *Attorney, Agent, or Firm* — Oblon, McClelland, Maier & Neustadt, L.L.P.

(57) ABSTRACT

Certain embodiments provide a parallel capacitor including a substrate configured by a dielectric, upper electrodes, and a lower electrode. The upper electrodes are provided in an upper electrode region on a surface of the substrate. The lower electrode is provided on an entire surface of a lower electrode region including a region corresponding to the upper electrode region of an underside of the substrate, the lower electrode region being wider than the region. A single-operation capacity of each capacitor on both ends is smaller than the single-operation capacity of a capacitor in a center portion. The capacitors on the both ends are configured by the upper electrodes arranged on both ends of the substrate, the lower electrode, and the substrate. The capacitor in the center portion is configured by the upper electrode arranged in a center portion of the substrate, the lower electrode, and the substrate.

17 Claims, 13 Drawing Sheets

(51) Int. Cl.
*H03K 5/13* (2014.01)
*H01L 23/66* (2006.01)
*H01L 27/08* (2006.01)
*H01L 49/02* (2006.01)

(52) U.S. Cl.
CPC ............... *H01L 28/60* (2013.01); *H03K 5/13* (2013.01); *H01L 2223/6611* (2013.01); *H01L 2223/6655* (2013.01); *H01L 2224/48195* (2013.01); *H01L 2224/49175* (2013.01); *H01L 2924/19041* (2013.01); *H01L 2924/19105* (2013.01); *H01L 2924/19107* (2013.01)

(56) References Cited

U.S. PATENT DOCUMENTS

| | | | |
|---|---|---|---|
| 5,838,032 | A | 11/1998 | Ting |
| 6,225,678 | B1 * | 5/2001 | Yach .................. H01L 27/0805 257/532 |
| 6,242,989 | B1 * | 6/2001 | Barber ..................... H01G 5/16 331/177 V |
| 6,614,645 | B1 * | 9/2003 | Sakurai ..................... H01G 4/38 257/E27.048 |
| 6,689,643 | B2 | 2/2004 | Cheng et al. |
| 7,067,869 | B2 | 6/2006 | Cheng et al. |
| 7,825,451 | B2 * | 11/2010 | Manning ............. H01L 27/0805 257/296 |
| 2003/0201476 | A1 | 10/2003 | Cheng et al. |
| 2004/0147087 | A1 | 7/2004 | Cheng et al. |
| 2004/0173876 | A1 * | 9/2004 | Musalem ................. H01G 5/04 257/595 |
| 2010/0140721 | A1 | 6/2010 | Takagi |
| 2013/0286534 | A1 * | 10/2013 | Ikehashi ................. H01G 5/04 361/281 |

FOREIGN PATENT DOCUMENTS

| | | |
|---|---|---|
| JP | 9-321509 | 12/1997 |
| JP | 11-238851 | 8/1999 |
| JP | 11-312932 | 11/1999 |
| JP | 2008-271044 | 11/2008 |
| JP | 2011-130395 | 6/2011 |
| JP | 2011-171697 | 9/2011 |
| WO | WO 98/18152 A2 | 4/1998 |

OTHER PUBLICATIONS

E. Yamashita, et al., "Simple CAD formulas of edge-compensated microstrip lines," IEEE MTT-S International Microwave Symposium Digest, IEEE Conference Publications, 1989, vol. 1, pp. 339-342.

* cited by examiner

PARALLEL CAPACITOR AND HIGH FREQUENCY SEMICONDUCTOR DEVICE

CROSS REFERENCE TO RELATED APPLICATIONS

This application is based upon and claims the benefit of priority from the prior Japanese Patent Application No. 2014-082787 filed in Japan on Apr. 14, 2014; the entire contents of which are incorporated herein by reference.

FIELD

Embodiments described herein relate generally to a parallel capacitor and a high frequency semiconductor device.

BACKGROUND

A high frequency semiconductor device in which FET chips including, for example, a plurality of field effect transistor (FET) cells are arranged in parallel in a package has an input/output matching circuit in the package. An input matching circuit includes a dividing circuit and a parallel capacitor in which a plurality of capacitors is arranged in parallel and an output matching circuit includes a combining circuit and a similar parallel capacitor.

When a high frequency is input into such a high frequency semiconductor device, the high frequency is distributed into a plurality of high frequencies by a dividing line and each distributed high frequency is input into each cell of the FET chip via each capacitor of the parallel capacitor. Each of the plurality of high frequencies output from each cell of a plurality of FET chips is input into a combining line via each capacitor of the parallel capacitor before being synthesized and output.

FIG. 19 is a schematic plan view when a conventional parallel capacitor is viewed from above. As shown in FIG. 19, a conventional parallel capacitor 2000 applied to each matching circuit described above includes a plurality of capacitors 2011 configured by providing a plurality of upper electrodes 2013 mutually having an equal area on the surface of a dielectric substrate 2012 like being spaced from each other and also providing a lower electrode 1014 on an underside of the dielectric substrate 2012.

FIGS. 20A, 20B, and 20C are each schematic sectional views of the conventional parallel capacitor along an alternate long and short dash line X-X' in FIG. 19. In FIGS. 20A, 20B, and 20C, reference numeral 2011e is attached to, among the plurality of capacitors 2011 shown in FIG. 19, the capacitors 2011 on both ends and reference numeral 2011c is attached to the capacitors 2011 in the center portion sandwiched between the capacitors 2011e on both ends. Similarly, reference numeral 2013e is attached to, among the plurality of upper electrodes 2013, the upper electrodes 2013 arranged on both ends of the dielectric substrate 2012 and reference numeral 2013c is attached to the upper electrodes 2013 arranged in the center portion sandwiched between both ends of the dielectric substrate 2012.

As shown in FIGS. 20A and 20B, the capacities of the capacitors 2011e, 2011c when a high frequency output from an RF power supply 15 is applied to, among the plurality of upper electrodes 2013e, 2013c, only one upper electrode, will be called single-operation capacities Ces, Ccs. For example, as shown in FIG. 20A, the capacity of the capacitor 2011e when a high frequency is applied to only the upper electrode 2013e on the left end in FIG. 20A is called the single-operation capacity Ces and, as shown in FIG. 20B, the capacity of the capacitor 2011c when a high frequency is applied to only the upper electrode 2013c in the center portion in FIG. 20B is called the single-operation capacity Ccs. As shown in FIG. 20C, the capacities of the capacitors 2011e, 2011c when a high frequency output from the RF power supply 15 is simultaneously applied to all of the plurality of upper electrodes 2013e, 2013c will be called simultaneous-operation capacities Cep, Ccp.

FIGS. 21A and 21B are each explanatory views illustrating the single-operation capacity of each capacitor constituting a conventional parallel capacitor and FIG. 21C is an explanatory view illustrating the simultaneous-operation capacity of each capacitor constituting the conventional parallel capacitor.

If, as shown in FIG. 21A, a high frequency output from the RF power supply 15 is applied to only the upper electrode 2013e on the left end of the parallel capacitor 2000, an electric line of force E extends up to the neighboring capacitor 2011c on one side of the capacitor 2011e to which the high frequency is applied and so-called coupling occurs, generating a coupling capacity Ce-cup. Further, the electric line of force E swells in an outer direction on the other end of the capacitor 2011e to which the high frequency is applied, generating a so-called fringing capacity Ce-fringe. As a result, the single-operation capacity of the capacitor 2011e increases only by the coupling capacity Ce-cup and the fringing capacity Ce-fringe from the original capacitor capacity Ce. The original capacitor capacity Ce means the capacity determined by an area Se of the upper electrode 2013e without including the coupling capacity Ce-cup and the fringing capacity Ce-fring. The original capacitor capacity Cc described below also has the same meaning.

If, as shown in FIG. 21B, a high frequency output from the RF power supply 15 is applied to only the upper electrode 2013c in the center of the parallel capacitor 2000, the electric line of force E extends up to the neighboring capacitors 2011c, 2011e on both sides of the capacitor 2011c to which the high frequency is applied and so-called coupling occurs, generating a coupling capacity Cc-cup. As a result, the single-operation capacity of the capacitor 2011c increases only by the coupling capacity Cc-cup from the original capacitor capacity Cc.

If a high frequency is applied to only the upper electrode 2013c in the center of the parallel capacitor 2000, the upper electrodes 2013c, 2013e contributing to coupling are arranged on both sides of the upper electrode 2013c to which the high frequency is applied and thus, the coupling capacity Cc-cup may be larger than the coupling capacity Ce-cup. Particularly when the upper electrodes 2013c, 2013e are arranged close to each other, the coupling capacity Cc-cup becomes larger than the total of the coupling capacity Ce-cup and the fringing capacity Ce-fringe.

In the conventional parallel capacitor 2000, therefore, even if the plurality of upper electrodes 2013e, 2013c having the mutually equal area is provided, the single-operation capacity of the capacitor 2011e on both ends and the single-operation capacity of the capacitor 2011c in the center portion may be different.

If, as shown in FIG. 21C, a high frequency output from the RF power supply 15 is simultaneously applied to all the upper electrodes 2013e, 2013c of the parallel capacitor 2000 (all the capacitors 2011e, 2011c are simultaneously operated), the upper electrode 2013e and the upper electrode 2013c are at the same potential and therefore, the electric line of force E as illustrated in FIG. 21C is generated in the dielectric substrate 2012.

That is, the electric line of force E extending linearly from the upper electrode 2013e toward the lower electrode 2014 is generated in the capacitor 2011e on both sides. Further, the electric line of force E swelling in the outer direction of the capacitor 2011e is also generated. Therefore, the simultaneous-operation capacity Cep of the capacitor 2011e increases only by the fringing capacity Ce-fringe from the original capacitor capacity Ce.

In the capacitor 2011c in the center portion, the upper electrode 2013c of the capacitor 2011c is close to the surrounding upper electrodes 2011c, 2011e and thus, only the electric line of force E extending linearly from the upper electrode 2013c toward the lower electrode 2014 is generated, and the electric line of force E swelling in the outer direction is hardly generated. Therefore, the simultaneous-operation capacity Ccp of the capacitor 2011c approximates to the original capacitor capacity Cc.

In the conventional parallel capacitor 2000, therefore, even if the plurality of upper electrodes 2013e, 2013c having the mutually equal area is provided, the simultaneous-operation capacity of the capacitor 2011e on both ends and the simultaneous-operation capacity of the capacitor 2011c in the center portion may be different.

If the spacing of the upper electrodes 2013e, 2013c is made sufficiently wider than the thickness of the dielectric substrate 2012, the electric line of force E swelling in the outer direction of the capacitor 2011c is also generated in the capacitor 2011c in the center portion. Therefore, the simultaneous-operation capacity Ccp of the capacitor 2011c increases only by the fringing capacity Ce-fringe from the original capacitor capacity Cc.

In general, however, the plurality of capacitors 2011c, 2011e is arranged in spacing substantially equal to the spacing of a plurality of FET cells constituting a FET chip and thus, the spacing of the upper electrodes 2013e, 2013c is narrower than the thickness of the dielectric substrate 2012.

Therefore, as has been described with reference to FIG. 21C, in the conventional parallel capacitor 2000, the simultaneous-operation capacity Cep of the capacitor 2011e on both ends and the simultaneous-operation capacity Ccp of the capacitor 2011c in the center portion may be different.

In a conventional high frequency semiconductor device having the conventional parallel capacitor 2000 as described above, power of an output high frequency may be smaller than desired power. One of the causes therefor is considered to be differences of the simultaneous-operation capacities Ccp, Cep of the plurality of capacitors 2011c, 2011e constituting the conventional parallel capacitor 2000. If there are differences of the simultaneous-operation capacities Ccp, Cep of the capacitors 2011c, 2011e, a phase shift of a high frequency output from each of the capacitors 2011c, 2011e arises. High frequencies are synthesized in a mutually phase-shifted state by a combining circuit of an output matching circuit and therefore, output power of high frequency decreases.

DESCRIPTION OF THE EMBODIMENTS

Figure 1:
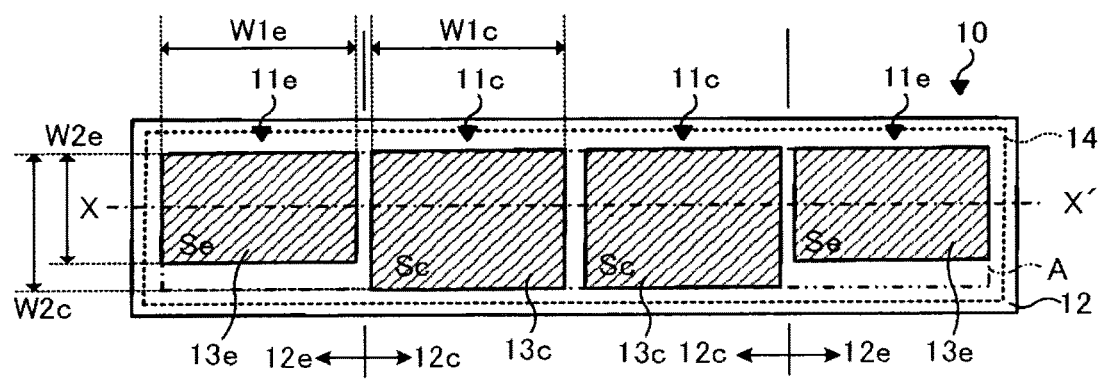
FIG. 1 is a schematic plan view when a parallel capacitor according to a first embodiment is viewed from above.

Certain embodiments provide a parallel capacitor including a dielectric substrate, a plurality of upper electrodes, and a lower electrode. The dielectric substrate includes both ends and a center portion between the both ends. The plurality of upper electrodes is provided in a row like in an upper electrode region on a surface of the dielectric substrate, the plurality of upper electrodes being spaced from each other. The lower electrode is provided on an entire surface of a lower electrode region including a region corresponding to the upper electrode region of an underside of the dielectric substrate, the lower electrode region being wider than the region. A single-operation capacity of each capacitors on the both ends is smaller than the single-operation capacity of a capacitor in the center portion, each capacitors on the both ends being configured by the upper electrodes arranged on the both ends of the dielectric substrate, the lower electrode, and the dielectric substrate, and the capacitor in the center portion being configured by the upper electrode arranged in the center portion of the dielectric substrate, the lower electrode, and the dielectric substrate.

Certain embodiments provide a high frequency semiconductor device including a field effect transistor (FET) chip configured by a plurality of FET cells, an input matching circuit, and an output matching circuit. The input matching circuit is connected to the FET chip and configured by a dividing line and a parallel capacitor. The output matching circuit is connected to the FET chip and configured by a combining line and a parallel capacitor. The parallel capacitor includes a dielectric substrate, a plurality of upper electrodes, and a lower electrode. The dielectric substrate includes both ends and a center portion between the both ends. The plurality of upper electrodes is provided in a row like in an upper electrode region on a surface of the dielectric substrate, the plurality of upper electrodes being spaced from each other. The lower electrode is provided on an entire surface of a lower electrode region including a region corresponding to the upper electrode region of an underside of the dielectric substrate, the lower electrode region being wider than the region. A single-operation capacity of each capacitors on the both ends is smaller than the single-operation capacity of a capacitor in the center portion, each capacitors on the both ends being configured by the upper electrodes arranged on the both ends of the dielectric substrate, the lower electrode, and the dielectric substrate, and the capacitor in the center portion being configured by the upper electrode arranged in the center portion of the dielectric substrate, the lower electrode, and the dielectric substrate.

Hereinafter, parallel capacitors and high frequency semiconductor devices according to the embodiments will be described. In the parallel capacitors described below, a plurality of capacitors is provided in parallel and the single-operation capacity of capacitors on both ends is smaller than the single-operation capacity of capacitors in the center portion.

First Embodiment

Figure 2:
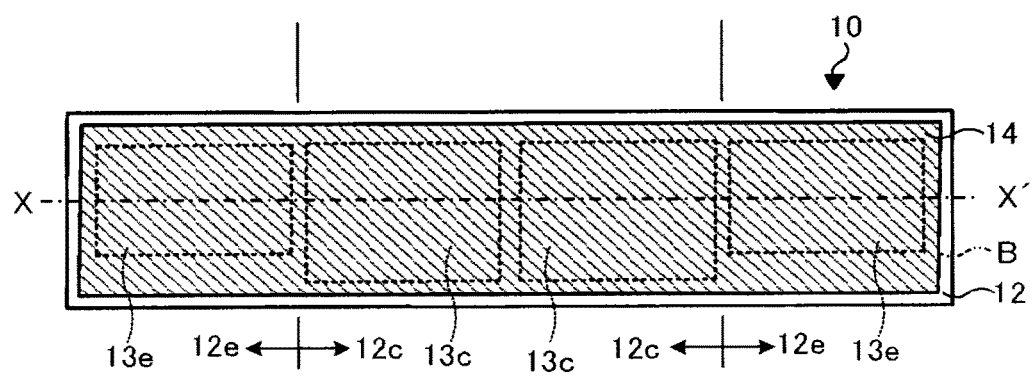
FIG. 2 is a schematic plan view when the parallel capacitor according to the first embodiment is viewed from below.
Figure 3:
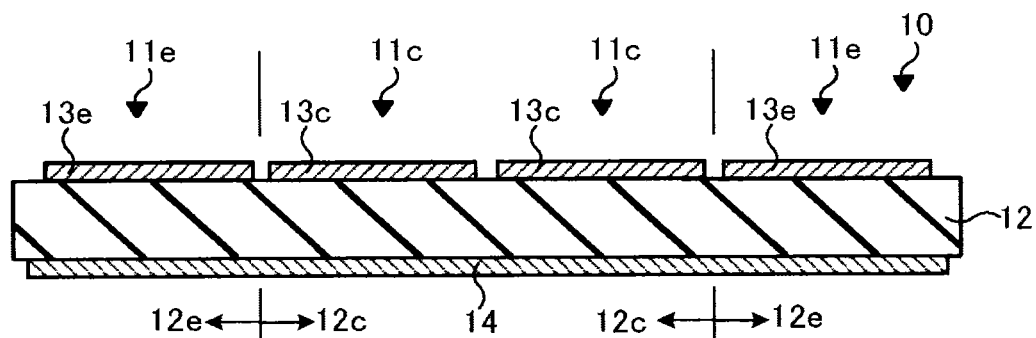
FIG. 3 is a schematic sectional view of the parallel capacitor along an alternate long and short dash line X-X' in FIGS. 1 and 2.

FIG. 1 is a schematic plan view when a parallel capacitor according to the first embodiment is viewed from above and FIG. 2 is a schematic plan view when the parallel capacitor according to the first embodiment is viewed from below. FIG. 3 is a schematic sectional view of the parallel capacitor along an alternate long and short dash line X-X' in FIGS. 1 and 2.

As shown in FIGS. 1 to 3, a parallel capacitor 10 is configured by providing a plurality (four, for example) of capacitors 11c, 11e on a same dielectric substrate 12.

As shown in FIGS. 1 and 3, the dielectric substrate 12 is a dielectric in a rectangular shape in which the arrangement direction of the capacitors 11c, 11e is the longitudinal direction and has a fixed thickness regardless of the location. A plurality of upper electrodes 13c, 13e in a substantially rectangular shape is provided in a row like being spaced from each other on a strip region A surrounded by an alternate long and two short dashes line in FIG. 1 of the surface of the dielectric substrate 12.

In the description that follows, the strip region A will be called an upper electrode region A. A portion of the dielectric substrate 12 where the upper electrode 13e arranged on both ends is provided will be called an end 12e and a portion of the dielectric substrate 12 surrounded by the both ends 12e will be called a center portion 12c.

Also in the description that follows, the direction parallel to the longitudinal direction of the dielectric substrate 12 will be called a first direction and the direction perpendicular to the longitudinal direction of the dielectric substrate 12 on a plane shown in FIG. 1 or 2 will be called a second direction.

As shown in FIG. 1, a length W1e in the first direction of the upper electrode 13e formed on the both ends 12e of the dielectric substrate 12 is substantially equal to a length W1c in the first direction of the upper electrode 13c formed in the center portion 12c of the dielectric substrate 12.

In addition, a length W2e in the second direction of the upper electrode 13e formed on the both ends 12e of the dielectric substrate 12 is shorter than a length W2c in the second direction of the upper electrode 13c formed in the center portion 12c of the dielectric substrate 12.

Accordingly, an area Se of the upper electrode 13e formed on the both ends 12e of the dielectric substrate 12 is smaller than an area Sc of the upper electrode 13c formed in the center portion 12c of the dielectric substrate 12.

As shown in FIGS. 2 and 3, a lower electrode 14 in a substantially rectangular shape is provided on the entire surface of a strip region B of the underside of the dielectric substrate 12.

In the description that follows, the strip region B will be called a lower electrode region B. The lower electrode region B is a strip region including the entire region corresponding to the upper electrode region A (region corresponding to immediately below the upper electrode region A) and wider than the corresponding region. The lower electrode region B is preferably a region having a size wider than the region corresponding to the upper electrode region A.

The parallel capacitor 10 configured as described above includes the upper electrodes 13c, 13e, the lower electrode 14, and the plurality of capacitors 11c, 11e configured by the dielectric substrate 12 (12c, 12e) between the electrodes 13c, 13e, 14.

As described above, the area Se of the upper electrode 13e provided on the both ends 12e of the dielectric substrate 12 is smaller than the area Sc of the upper electrode 13c provided in the center portion 12c of the dielectric substrate 12. Thus, the single-operation capacity Ces of, among the plurality of capacitors 11c, 11e, the capacitor 11e (capacitor 11e on both ends) including the upper electrode 13e provided on the both ends 12e of the dielectric substrate 12 is smaller than the single-operation capacity Ccs of the capacitor 11c (capacitor 11c in the center portion) including the upper electrode 13c provided in the center portion 12c of the dielectric substrate 12. The difference between the single-operation capacity Ces of the capacitor 11e on both ends and the single-operation capacity Ccs of the capacitor 11c in the center portion is larger than the difference between the single-operation capacity Ces of the capacitor 2011e on both ends and the single-operation capacity Ccs of the capacitor 2011c in the center portion in the conventional parallel capacitor 2000.

When compared with the conventional parallel capacitor 2000, however, the difference between the simultaneous-operation capacity Cep of the capacitor 11e on both ends and the simultaneous-operation capacity Ccp of the capacitor 11c in the center portion can be made smaller. Particularly by adjusting the area Se of the upper electrode 13e, the simultaneous-operation capacities Cep, Ccp during parallel operation of all the capacitors 11c, 11e can be made equal. This is because the area Se of the upper electrode 13e is smaller than the area Sc of the upper electrode 13c and the original capacitor capacity Ce of the capacitor 11e on both ends is smaller than the original capacitor capacity Cc of the capacitor 11c in the center portion.

Figure 4:
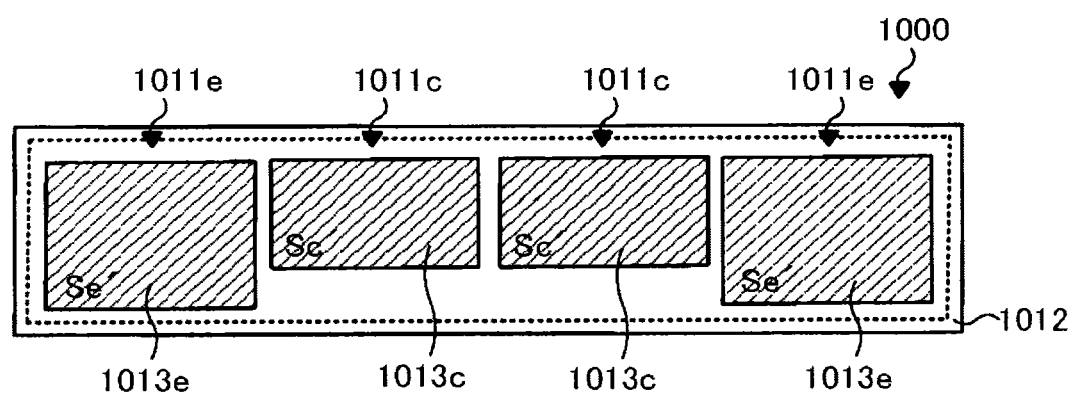
FIG. 4 is a schematic plan view when a parallel capacitor according to a comparative example is viewed from above.

In a parallel capacitor 1000 according to a comparative example, by contrast, as shown in FIG. 4, an area Se' of an upper electrode 1013e is larger than an area Sc' of an upper electrode 1013c and the original capacitor capacity Ce of a capacitor 1011e on both ends is larger than the original capacitor capacity Cc of a capacitor 1011c in the center portion. Thus, the difference between the single-operation capacity Ces of the capacitor 1011e on both ends and the single-operation capacity Ccs of the capacitor 1011c in the center portion can be made smaller than the difference of the conventional parallel capacitor 2000. However, the difference between the simultaneous-operation capacity Ces of the capacitor 1011e on both ends and the simultaneous-operation capacity Ccs of the capacitor 1011c in the center portion is larger than the difference of the conventional parallel capacitor 2000.

In the parallel capacitor 10 according to the first embodiment, as described above, the single-operation capacity Ces of the capacitor 11e on both ends is made smaller than the single-operation capacity Ccs of the capacitor 11c in the center portion by making the area Se of the upper electrode 13e of the capacitor 11e on both ends smaller than the area Sc of the upper electrode 13c of the capacitor 11c in the center portion. As a result, when a parallel operation of the parallel capacitor 10 as described above is performed, the difference of the simultaneous-operation capacities Cep, Ccp during parallel operation of the respective capacitors 11c, 11e can be made smaller.

In the parallel capacitor 10 according to the first embodiment, the single-operation capacity Ces of the capacitor 11e on both ends is made smaller than the single-operation capacity Ccs of the capacitor 11c in the center portion by making the area Se of the upper electrode 13e of the capacitor 11e on both ends smaller than the area Sc of the upper electrode 11c of the capacitor 11c in the center portion, but if the area Se of the upper electrode 13e is smaller than the area Sc of the upper electrode 13c, the shape of the upper electrode 13e of the capacitor 11e on both ends is not limited to the shape shown in FIG.

Modification of the First Embodiment

Figure 5:
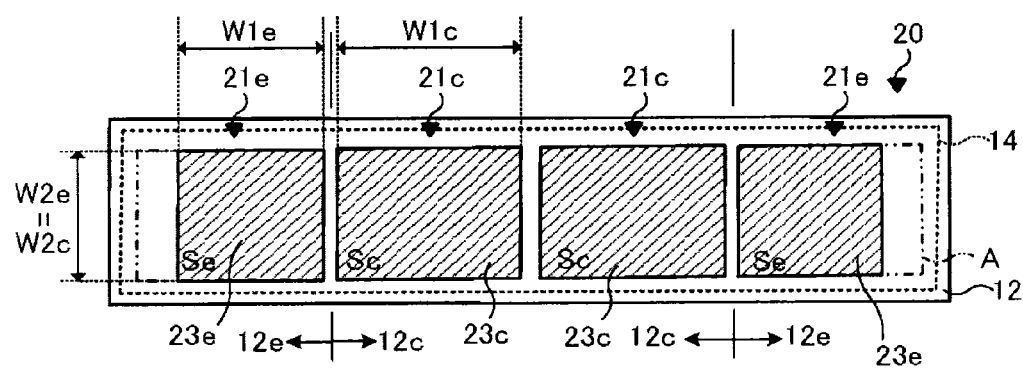
FIG. 5 is a schematic plan view when a parallel capacitor according to a first modification of the first embodiment is viewed from above.

FIG. 5 is a schematic plan view when a parallel capacitor 20 according to a first modification of the first embodiment is viewed from above. In FIG. 5, the same reference numerals are attached to the same portions as those of the parallel capacitor 10 according to the first embodiment.

As shown in FIG. 5, the length W1e in the first direction of an upper electrode 23e formed on the both ends 12e of the dielectric substrate 12 is shorter than the length W1c in the first direction of an upper electrode 23c formed in the center portion 12c of the dielectric substrate 12.

The length W2e in the second direction of the upper electrode 23e formed on the both ends 12e of the dielectric substrate 12 is substantially equal to the length W2c in the second direction of the upper electrode 23c formed in the center portion 12c of the dielectric substrate 12.

Accordingly, the single-operation capacity Ces of the capacitor 21e on both ends may be made smaller than the single-operation capacity Ccs of the capacitor 21c in the center portion by making the area Se of the upper electrode 23e formed on the both ends 12e of the dielectric substrate 12 smaller than the area Sc of the upper electrode 23c formed in the center portion 12c of the dielectric substrate 12.

Figure 6:
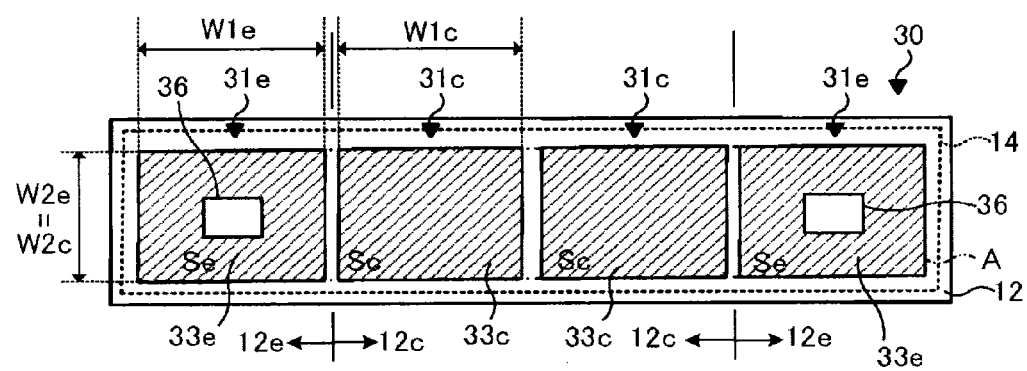
FIG. 6 is a schematic plan view when a parallel capacitor according to a second modification of the first embodiment is viewed from above.

FIG. 6 is a schematic plan view when a parallel capacitor 30 according to a second modification of the first embodiment is viewed from above. In FIG. 6, the same reference numerals are attached to the same portions as those of the parallel capacitor 10 according to the first embodiment.

As shown in FIG. 6, an upper electrode 33c in the center portion 12c of the dielectric substrate 12 is formed in a rectangular shape in which the length in the first direction is W1c and the length in the second direction is W2c. Then, an upper electrode 33e formed on the both ends 12e of the dielectric substrate 12 is formed so as to be a ring shape having an opening 36 near the center of a rectangle in which the length in the first direction is W1e (=W1c) and the length in the second direction is W2e (=W2c).

Accordingly, the single-operation capacity Ces of the capacitor 31e on both ends may be made smaller than the single-operation capacity Ccs of the capacitor 31c in the center portion by making the area Se of the upper electrode 23e formed on the both ends 12e of the dielectric substrate 12 smaller than the area Sc of the upper electrode 23c formed in the center portion 12c of the dielectric substrate 12.

Figure 7:
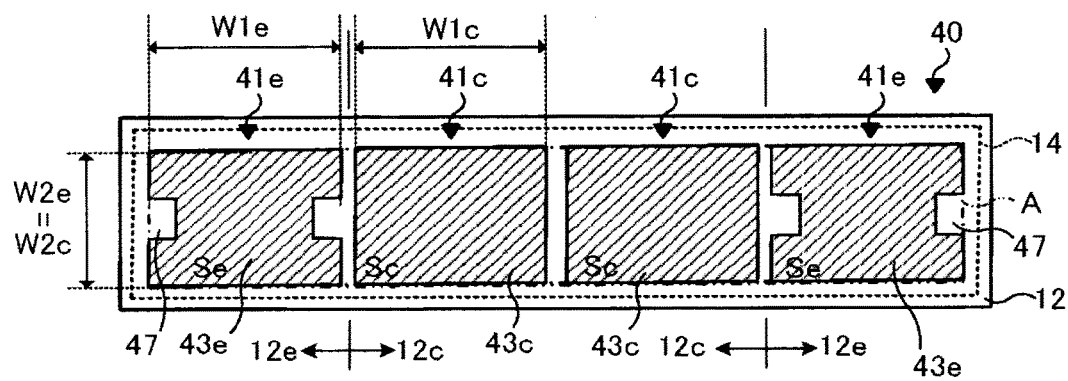
FIG. 7 is a schematic plan view when a parallel capacitor according to a third modification of the first embodiment is viewed from above.

FIG. 7 is a schematic plan view when a parallel capacitor 40 according to a third modification of the first embodiment is viewed from above. In FIG. 7, the same reference numerals are attached to the same portions as those of the parallel capacitor 10 according to the first embodiment.

As shown in FIG. 7, an upper electrode 43c in the center portion 12c of the dielectric substrate 12 is formed in a rectangular shape in which the length in the first direction is W1c and the length in the second direction is W2c. Then, an upper electrode 43e formed on the both ends 12e of the dielectric substrate 12 is formed so as to be a shape having a notch 47 in a portion of a rectangle in which the length in the first direction is W1e (=W1c) and the length in the second direction is W2e (=W2c).

Accordingly, the single-operation capacity Ces of the capacitor 41e on both ends may be made smaller than the single-operation capacity Ccs of the capacitor 41c in the center portion by making the area Se of the upper electrode 43e formed on the both ends 12e of the dielectric substrate 12 smaller than the area Sc of the upper electrode 43c formed in the center portion 12c of the dielectric substrate 12.

Because the single-operation capacity Ces of the capacitors 21e, 31e, 41e on both ends is smaller than the single-operation capacity Ccs of the capacitors 21c, 31c, 41c in the center portion, the parallel capacitors 20, 30, 40 according to the first to third modifications described above can also achieve the same effect as that of the parallel capacitor 10 according to the first embodiment.

In the parallel capacitor 10 according to the first embodiment, the single-operation capacity Ces of the capacitor 11e on both ends is made smaller than the single-operation capacity Ccs of the capacitor 11c in the center portion by making the area Se of the upper electrode 13e of the capacitor 11e on both ends smaller than the area Sc of the upper electrode 13c of the capacitor 11c in the center portion and the difference between the simultaneous-operation capacities Cep, Ccp during parallel operation of the capacitors 11c, 11e can thereby be made smaller.

In other words, to make the difference between the simultaneous-operation capacities Cep, Ccp during parallel operation of a plurality of capacitors smaller, the single-operation capacity Ces of the capacitor on both ends may be made smaller than the single-operation capacity Ccs of the capacitor in the center portion.

In general, the capacity C of a capacitor can be represented by using the following formula:

$$C = \in \times (S/d)$$

where $\in$ is the dielectric constant of the dielectric, S is the area of the electrode, and d is the distance between the electrodes.

As is evident from the above formula, in addition to making the area S of an electrode smaller like the first embodiment, the distance d between the electrodes may be made longer or the dielectric constant $\in$ of the dielectric may be made lower as a means for making the capacity C smaller. A parallel capacitor to which such a means is applied will be described below.

Second Embodiment

Figure 8:
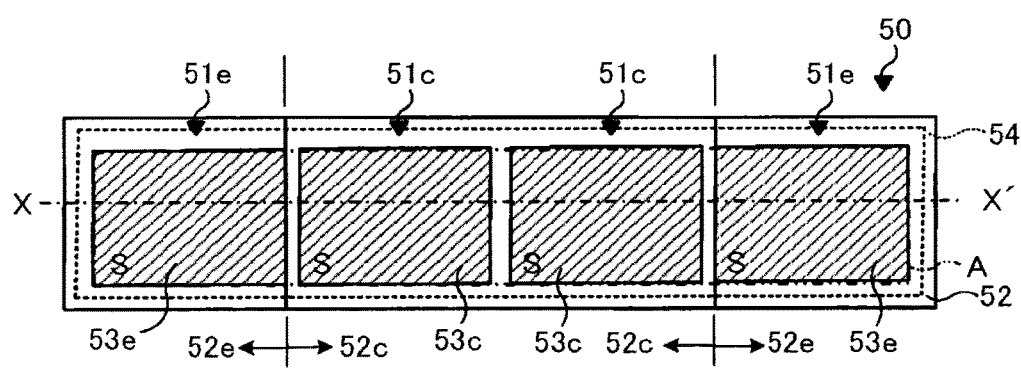
FIG. 8 is a schematic plan view when a parallel capacitor according to a second embodiment is viewed from above.
Figure 9:
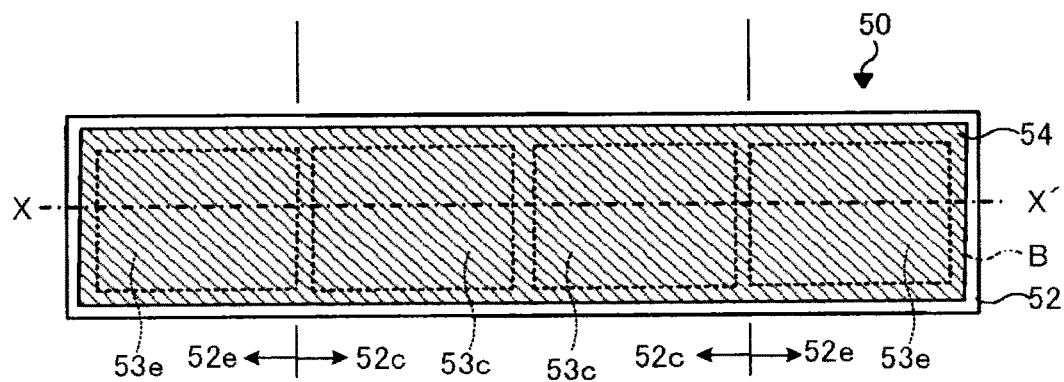
FIG. 9 is a schematic plan view when the parallel capacitor according to the second embodiment is viewed from below.
Figure 10:
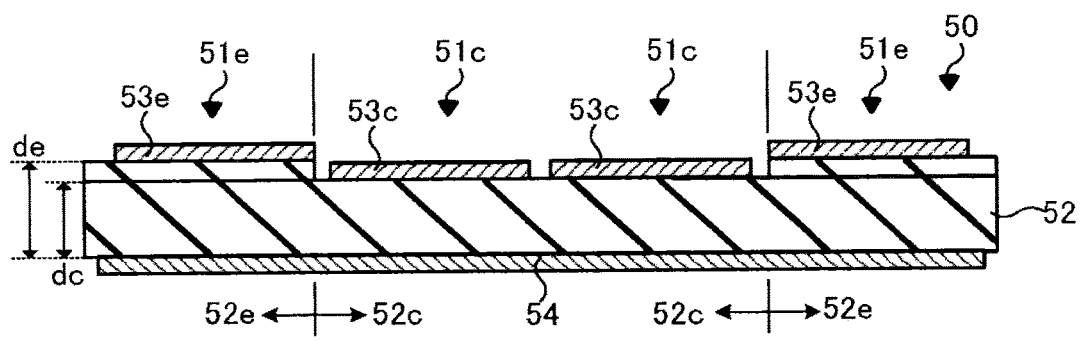
FIG. 10 is a schematic sectional view of the parallel capacitor according to the second embodiment along the alternate long and short dash line X-X' in FIGS. 8 and 9.

FIG. 8 is a schematic plan view when a parallel capacitor according to the second embodiment is viewed from above and FIG. 9 is a schematic plan view when the parallel capacitor according to the second embodiment is viewed from below. FIG. 10 is a schematic sectional view of the parallel capacitor according to the second embodiment along the alternate long and short dash line X-X' in FIGS. 8 and 9.

Also a parallel capacitor 50 shown in FIGS. 8 to 10 is configured by, like the parallel capacitor according to the first embodiment, providing a plurality (four, for example) of capacitors 51c, 51e on a same dielectric substrate 52.

As shown in FIGS. 8 and 10, the dielectric substrate 52 is a dielectric in a rectangular shape in which the arrangement direction of the capacitors 51c, 51e is the longitudinal direction. A plurality of upper electrodes 53c, 53e in a substantially rectangular shape with the mutually equal area S is provided in a row like being spaced from each other on the strip upper electrode region A of the surface of the dielectric substrate 52.

Also as shown in FIGS. 8 and 10, a lower electrode 54 in a substantially rectangular shape is provided on the entire surface of the lower electrode region B of the underside of the dielectric substrate 52. Incidentally, the lower electrode region B is a strip region including the entire region corresponding to the upper electrode region A (region corresponding to immediately below the upper electrode region A) and wider than the corresponding region. The lower electrode region B is preferably a region having a size wider than the region corresponding to the upper electrode region A.

The parallel capacitor 50 configured as described above is configured by providing the upper electrodes 53c, 53e, the lower electrode 54, and the plurality of capacitors 51c, 51e configured by the dielectric substrate 52 between the electrodes 53c, 53e, 54 being arranged in parallel. As shown in FIG. 10, a thickness de of the dielectric substrate 52 of the capacitor 51e on both ends, that is, the dielectric substrate 52e on both ends is made thicker than a thickness dc of the dielectric substrate 52 of the capacitor 51e in the center portion, that is, the dielectric substrate 52c in the center portion. Therefore, the single-operation capacity Ces of the capacitor 51e on both ends is smaller than the single-operation capacity Ccs of the capacitor 51c in the center portion.

In the parallel capacitor 50 according to the second embodiment, as described above, like the parallel capacitor 10 according to the first embodiment, the single-operation capacity Ces of the capacitor 51e on both ends is made smaller than the single-operation capacity Ccs of the capacitor 51c in the center portion by making the thickness de of the dielectric substrate 52 of the capacitor 51e on both ends (dielectric substrate 52e on both ends) thicker than the thickness dc of the dielectric substrate 52 of the capacitor 51c in the center portion (dielectric substrate 52c in the center portion). As a result, when a parallel operation of the parallel capacitor 50 as described above is performed, the difference of the simultaneous-operation capacities Cep, Ccp during parallel operation of the respective capacitors 51c, 51e can be made smaller.

Modification

Figure 11:
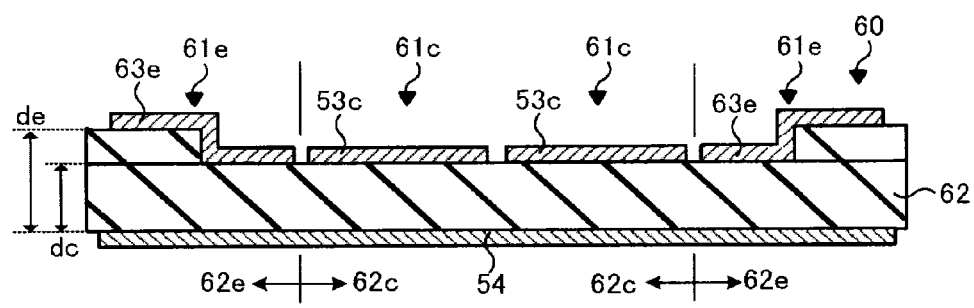
FIG. 11 is a sectional view corresponding to FIG. 10 of a parallel capacitor according to a modification of the second embodiment.

FIG. 11 is a sectional view corresponding to FIG. 10 of a parallel capacitor according to a modification of the second embodiment. In FIG. 11, the same reference numerals are attached to the same portions as those of the parallel capacitor 50 according to the second embodiment.

In a parallel capacitor 60 according to the modification, as shown in FIG. 11, the thickness de of only a portion of a dielectric substrate 62e on both ends contained in a capacitor 61e on both ends may be made thicker than the thickness dc of a dielectric substrate 62c in the center portion contained in a capacitor 61c in the center portion. Also in this case, the single-operation capacity Ces of the capacitor 61e on both ends can be made smaller than the single-operation capacity Ccs of the capacitor 61c in the center portion.

Because there is a step on the surface of the dielectric substrate 62 (dielectric substrate 62e on both ends) contained in the capacitor 61e on both ends, an upper electrode 63e is provided so as to be in contact with the surface of the dielectric substrate 62 along the step.

Because the single-operation capacity Ces of the capacitor 61e on both ends is smaller than the single-operation capacity Ccs of the capacitor 61c in the center portion, the parallel capacitor 60 according to the modification described above can also achieve the same effect as that of the parallel capacitor 50 according to the second embodiment.

Third Embodiment

Figure 12:
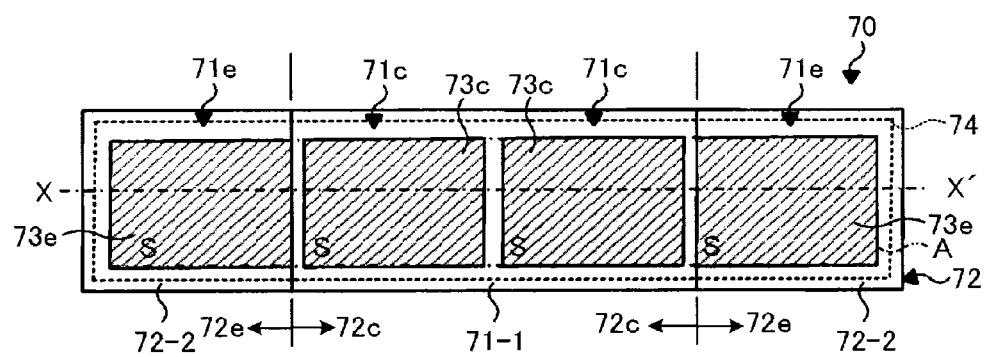
FIG. 12 is a schematic plan view when a parallel capacitor according to a third embodiment is viewed from above.
Figure 13:
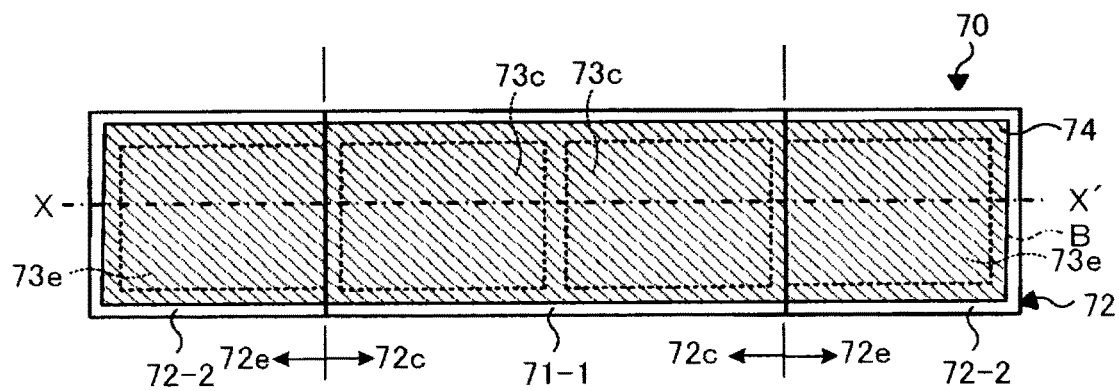
FIG. 13 is a schematic plan view when the parallel capacitor according to the third embodiment is viewed from below.
Figure 14:
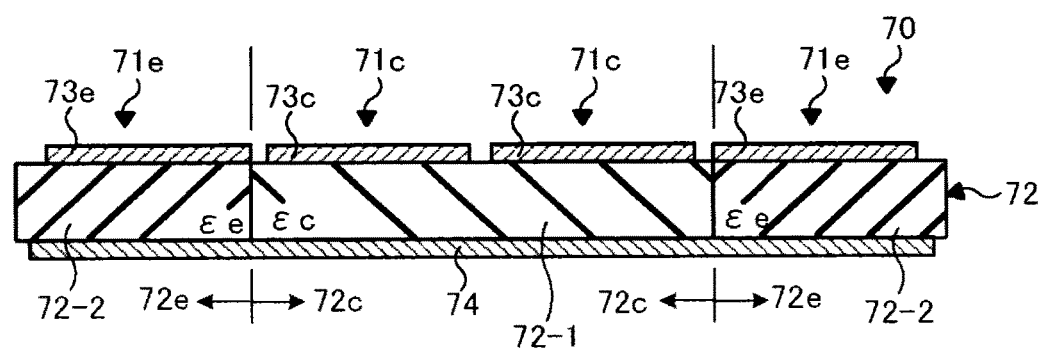
FIG. 14 is a schematic sectional view of the parallel capacitor according to the third embodiment along the alternate long and short dash line X-X' in FIGS. 12 and 13.

FIG. 12 is a schematic plan view when a parallel capacitor according to a third embodiment is viewed from above and FIG. 13 is a schematic plan view when the parallel capacitor according to the third embodiment is viewed from below. FIG. 14 is a schematic sectional view of the parallel capacitor according to the third embodiment along the alternate long and short dash line X-X' in FIGS. 12 and 13.

Also a parallel capacitor 70 shown in FIGS. 12 to 14 is configured by, like the parallel capacitor 10 according to the first embodiment, providing a plurality (four, for example) of capacitors 71c, 71e on a same dielectric substrate 72.

As shown in FIGS. 12 and 14, the dielectric substrate 72 is a dielectric in a rectangular shape in which the arrangement direction of the capacitors 71c, 71e is the longitudinal direction. A plurality of upper electrodes 73c, 73e in a substantially rectangular shape with the mutually equal area S is provided in a row like being spaced from each other on the strip upper electrode region A of the surface of the dielectric substrate 72.

Also as shown in FIGS. 13 and 14, a lower electrode 74 in a substantially rectangular shape is provided on the entire surface of the lower electrode region B of the underside of the dielectric substrate 72. Incidentally, the lower electrode region B is a strip region including the entire region corresponding to the upper electrode region A (region corresponding to immediately below the upper electrode region A) and wider than the corresponding region. The lower electrode region B is preferably a region having a size wider than the region corresponding to the upper electrode region A.

The parallel capacitor 70 configured as described above is configured by providing the upper electrodes 73c, 73e, the lower electrode 74, and the plurality of capacitors 71c, 71e configured by the dielectric substrate 72 between the electrodes 73c, 73e, 74 being arranged in parallel. As shown in FIG. 14, the entire dielectric substrate (dielectric substrate 72c in the center portion) of the capacitor 71c in the center portion is configured by a first dielectric material 72-1 having a dielectric constant $\in_c$ and the entire dielectric substrate (dielectric substrate 72e on both ends) of the capacitor 71e on both ends is configured by a second dielectric material 72-2 having a dielectric constant $\in_e$, which is smaller than the dielectric constant $\in_c$. Therefore, the single-operation capacity Ces of the capacitor 71e on both ends is smaller than the single-operation capacity Ccs of the capacitor 71c in the center portion.

In the parallel capacitor 70 according to the third embodiment, as described above, like the parallel capacitor 10 according to the first embodiment, the single-operation capacity Ces of the capacitor 71e on both ends is made smaller than the single-operation capacity Ccs of the capacitor 71c in the center portion by making the dielectric constant $\in_e$ of the dielectric substrate 72e on both ends smaller than the dielectric constant $\in_c$ of the dielectric substrate 72c in the center portion. As a result, when a parallel operation of the parallel capacitor 70 as described above is performed, the difference of the simultaneous-operation capacities Cep, Ccp during parallel operation of the respective capacitors 71c, 71e can be made smaller.

First and Second Modifications

Figure 15:
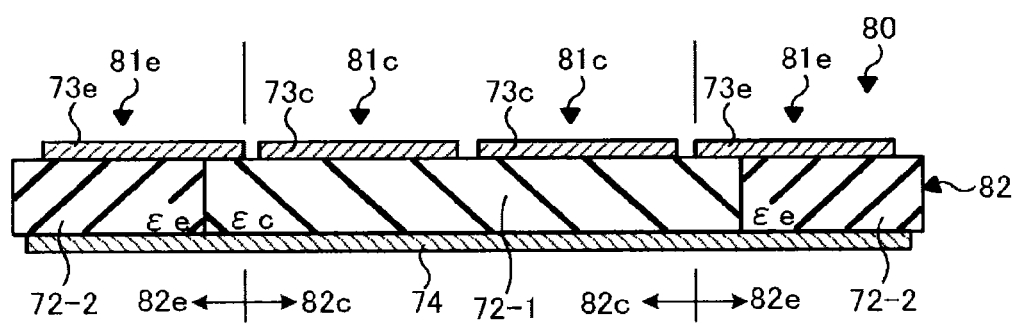
FIG. 15 is a sectional view corresponding to FIG. 14 of a parallel capacitor according to a first modification of the third embodiment.
Figure 16:
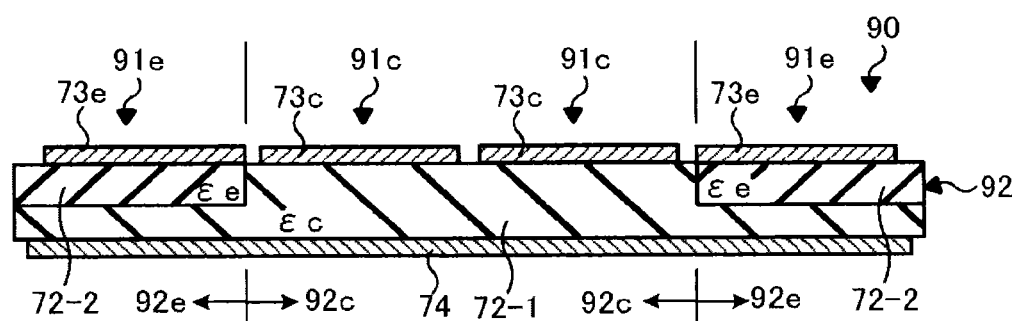
FIG. 16 is a sectional view corresponding to FIG. 14 of a parallel capacitor according to a second modification of the third embodiment.

FIG. 15 is a sectional view corresponding to FIG. 14 of a parallel capacitor 80 according to a first modification of the third embodiment. FIG. 16 is a sectional view corresponding to FIG. 14 of a parallel capacitor 90 according to a second modification of the third embodiment. In FIGS. 15 and 16, the same reference numerals are attached to the same portions as those of the parallel capacitor 70 according to the third embodiment.

As shown in FIGS. 15 and 16, dielectric substrates 82c, 92c in the center portion contained in capacitors 81c, 91c in the center portion of dielectric substrates 82, 92 are formed of only the first dielectric material 72-1 with the larger dielectric constant $\in_c$. Then, only a portion of the dielectric substrates 82e, 92e on both ends contained in capacitors 81e, 91e on both ends may be formed of the second dielectric material 72-2 with the smaller dielectric constant $\in_e$ and other portions may be formed of the first dielectric material 72-1 with the larger dielectric constant $\in_c$. Also in this case, the single-operation capacity Ces of the capacitors 81e, 91e on both ends can be made smaller than the single-operation capacity Ccs of the capacitors 81c, 91c in the center portion.

Because the single-operation capacity Ces of the capacitors 81e, 91e on both ends is smaller than the single-operation capacity Ccs of the capacitors 81c, 91c in the center portion, the parallel capacitors 80, 90 according to the first and second modifications described above can also achieve the same effect as that of the parallel capacitor 70 according to the third embodiment.

Application Example

The parallel capacitors 10, 20, 30, 40, 50, 60, 70, 80, 90 according to each embodiment described above can be applied to a portion of an input/output matching circuit of a high frequency semiconductor device. In the high frequency semiconductor device, for example, a plurality of field effect transistor (FET) chips configured by arranging a plurality of FET cells in parallel is arranged.

Figure 17:
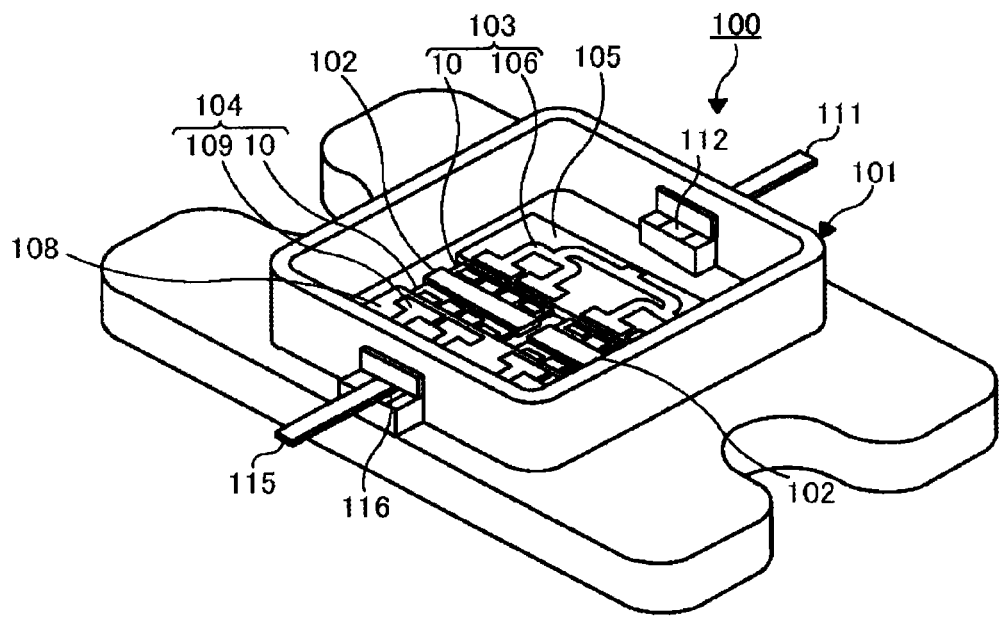
FIG. 17 is a perspective view schematically showing a high frequency semiconductor device including the parallel capacitor according to the first embodiment.
Figure 18:
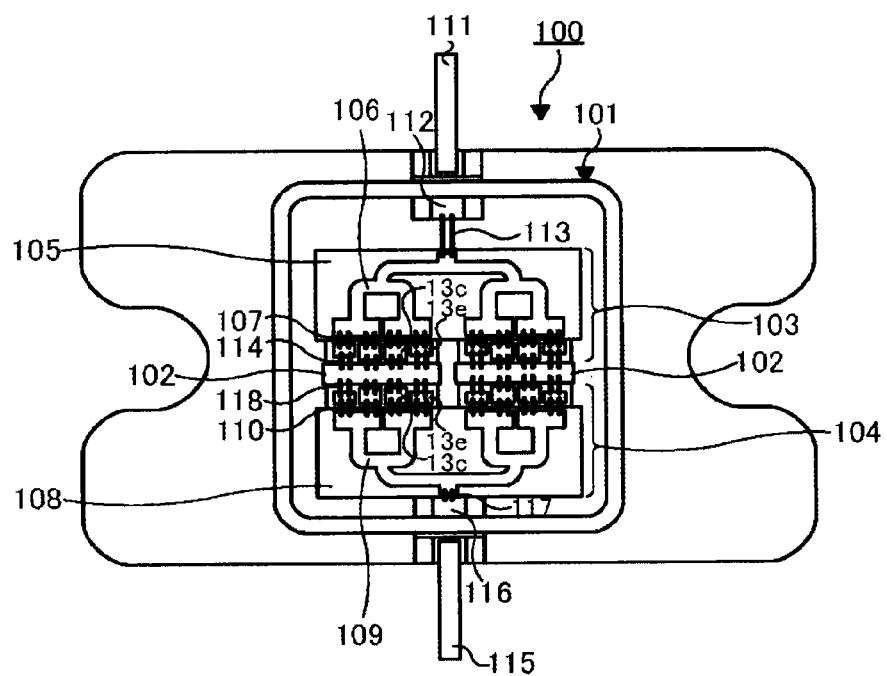
FIG. 18 is a schematic plan view when the high frequency semiconductor device including the parallel capacitor according to the first embodiment is viewed from above.

FIG. 17 is a perspective view schematically showing a high frequency semiconductor device 100 including parallel capacitors 10in, 10out similar to, for example, the parallel capacitor 10 according to the first embodiment and FIG. 18 is a top view schematically showing the high frequency semiconductor device 100 including the parallel capacitor 10 according to the first embodiment. In FIG. 17, each connected conductor described below is omitted.

In the high frequency semiconductor device 100, as shown in FIGS. 17 and 18, a plurality of FET chips 102 is arranged in a high frequency semiconductor package 101 and an input matching circuit 103 is provided on the input side of the plurality of FET chips 102 and an output matching circuit 104 is provided on the output side of the plurality of FET chips 102.

The input matching circuit 103 includes a dividing line 106 and the parallel capacitor 10in provided on the surface of a dielectric substrate 105. The input matching circuit 103 is configured by connecting a plurality of divided output terminals of the dividing line 106 and the parallel capacitor 10in by a connecting conductor 107 such as a wire.

The output matching circuit 104 includes a combining line 109 and the parallel capacitor 10out provided on the surface of a dielectric substrate 108. The output matching circuit 104 is configured by connecting a plurality of divided input terminals of the combining line 109 and the parallel capacitor 10out by a connecting conductor 110 such as a wire.

The input terminals of the dividing line 106 of the input matching circuit 103 are connected to an input pattern 112 connected to an input lead wire 111 included in the high frequency semiconductor package 101 by a connecting conductor 113 inside the package 101. Each of the upper electrodes 13c, 13e of the parallel capacitor 10in of the input matching circuit 103 and each cell of the plurality of FET chips 102 are connected by a connecting conductor 114 such as a wire.

Similarly, the output terminals of the combining line 109 of the output matching circuit 104 are connected to an output pattern 116 connected to an output lead wire 115 included in the high frequency semiconductor package 101 by a connecting conductor 117 inside the package 101. Each of the upper electrodes 13c, 13e of the parallel capacitor 10out of the output matching circuit 104 and each cell of the plurality of FET chips 102 are connected by a connecting conductor 118 such as a wire.

When a predetermined high frequency is input from the input lead wire 111 of the high frequency semiconductor device 100, the high frequency is divided by the dividing line 106 into a plurality of high frequencies. The plurality of distributed high frequencies is input into the upper electrodes 13c, 13e of the parallel capacitor 10in and the parallel capacitor 10in performs a parallel operation.

The difference of the simultaneous-operation capacities Cep, Ccp during parallel operation of a plurality of capacitors included in the parallel capacitors 10in is small and thus, phase differences of the plurality of high frequencies output from the plurality of capacitors can be made small.

In this manner, each of the plurality of high frequencies output from the parallel capacitor 10in is input into each cell of the FET chip 102 and high frequency power is amplified. The amplified high frequency is input into the parallel capacitor 10out of the output matching circuit 104. Then, the parallel capacitor 10out performs a parallel operation.

Also in the parallel capacitor 10out, the difference of the simultaneous-operation capacities Cep, Ccp during parallel operation of a plurality of capacitors included therein is small and thus, phase differences of the plurality of high frequencies output from the plurality of capacitors can be made small.

In this manner, the plurality of high frequencies output from the parallel capacitor 10out is synthesized into one high frequency by the combining line 109 in the end and output from the output lead wire 115. Phase differences of the plurality of high frequencies before being input into the combining line 109 for synthesis are small and thus, high synthesis efficiency can be obtained.

Figure 19:
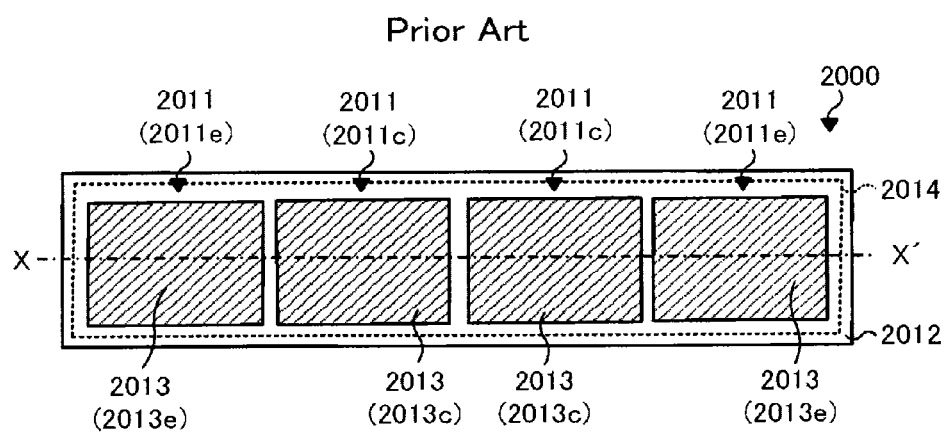
FIG. 19 is a schematic plan view when a conventional parallel capacitor is viewed from above.
Figure 20A:
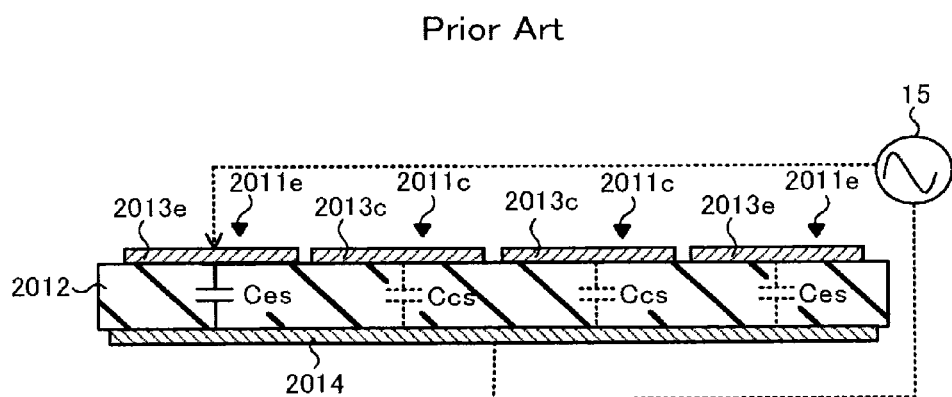
FIG. 20A is a schematic sectional view showing a state in which a high frequency is applied to only an upper electrode on the left end of the conventional parallel capacitor along the alternate long and short dash line X-X' in FIG. 19.
Figure 20B:
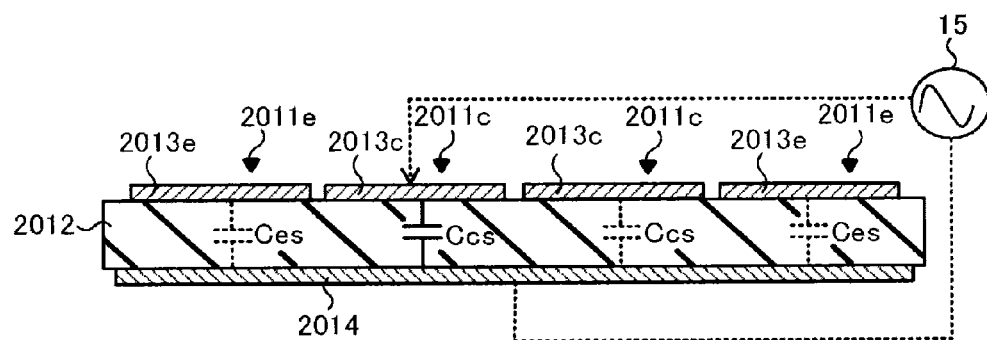
FIG. 20B is a schematic sectional view showing a state in which the high frequency is applied to only the upper electrode in the center of the conventional parallel capacitor along the alternate long and short dash line X-X' in FIG. 19.
Figure 20C:
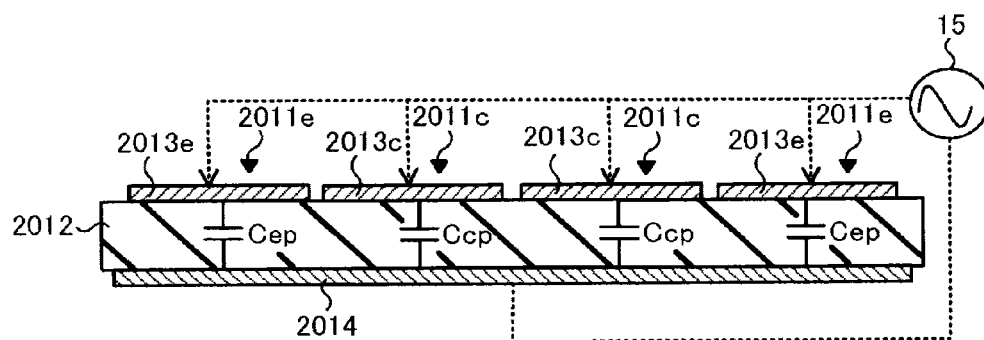
FIG. 20C is a schematic sectional view showing a state in which the high frequency is applied to all of a plurality of the upper electrodes of the conventional parallel capacitor along the alternate long and short dash line X-X' in FIG. 19.
Figure 21A:
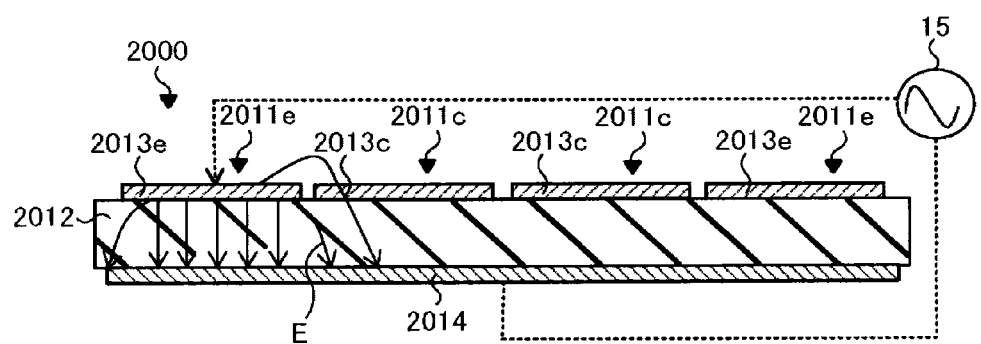
FIG. 21A is an explanatory view illustrating a single-operation capacity of each capacitor constituting the conventional parallel capacitor.
Figure 21B:
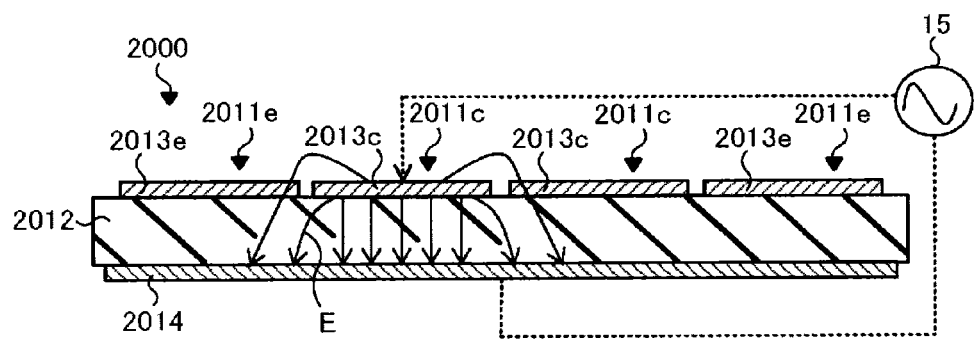
FIG. 21B is an explanatory view illustrating the single-operation capacity of each capacitor constituting the conventional parallel capacitor.
Figure 21C:
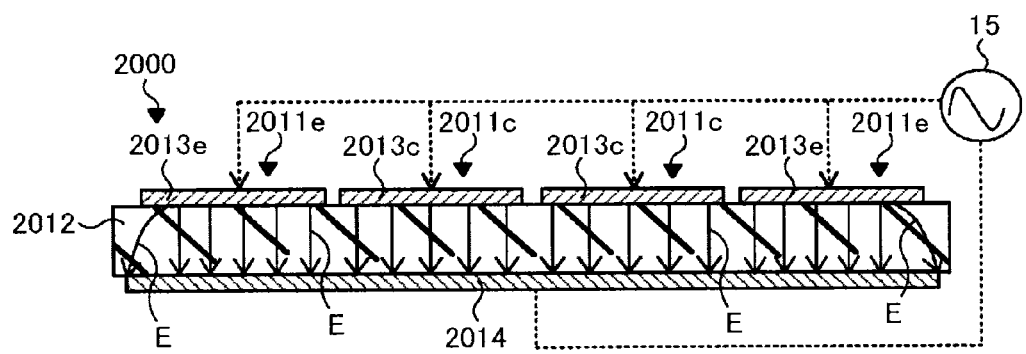
FIG. 21C is an explanatory view illustrating a simultaneous-operation capacity of each capacitor constituting the conventional parallel capacitor.

By applying, for example, the parallel capacitors 10in, 10out according to the first embodiment to a portion of the input/output matching circuits 103, 104 of the high frequency semiconductor device 100, when compared with high frequencies output from a high frequency semiconductor device to which the conventional parallel capacitor 2000 (FIG. 19) is applied, power of high frequencies output from the output lead wire 115 can be inhibited from decreasing and output characteristics of the high frequency semiconductor device 100 can be improved.

Though not illustrated, by applying any of the above parallel capacitors 20, 30, 40, 50, 60, 70, 80, 90 other than the parallel capacitor 10 according to the first embodiment, output characteristics of the high frequency semiconductor device can similarly be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A parallel capacitor comprising:
   a dielectric substrate including both ends and a center portion between the both ends;
   a plurality of upper electrodes provided in a row like in an upper electrode region of a surface of the dielectric substrate, the plurality of upper electrodes being spaced from each other; and
   a lower electrode provided on an entire surface of a lower electrode region including a region corresponding to the upper electrode region of an underside of the dielectric substrate, the lower electrode region being wider than the region, wherein
   a single-operation capacity of each capacitors on the both ends is smaller than the single-operation capacity of a capacitor in the center portion, each capacitors on the both ends being configured by the upper electrodes arranged on the both ends of the dielectric substrate, the lower electrode, and the dielectric substrate, and the capacitor in the center portion being configured by the upper electrode arranged in the center portion of the dielectric substrate, the lower electrode, and the dielectric substrate.

2. The parallel capacitor according to claim 1, wherein an area of the upper electrode arranged on the both ends of the dielectric substrate is smaller than the area of the upper electrode arranged in the center portion of the dielectric substrate.

3. The parallel capacitor according to claim 2, wherein when an arrangement direction of the plurality of upper electrodes is defined as a first direction and a direction perpendicular to the first direction is defined as a second direction,
   a length in the second direction of the upper electrode arranged on the both ends of the dielectric substrate is shorter than the length in the second direction of the upper electrode arranged in the center portion of the dielectric substrate.

4. The parallel capacitor according to claim 2, wherein when an arrangement direction of the plurality of upper electrodes is defined as a first direction and a direction perpendicular to the first direction is defined as a second direction,
   a length in the first direction of the upper electrode arranged on the both ends of the dielectric substrate is shorter than the length in the first direction of the upper electrode arranged in the center portion of the dielectric substrate.

5. The parallel capacitor according to claim 2, wherein the upper electrode arranged on the both ends of the dielectric substrate has a ring shape with an opening near a center thereof.

6. The parallel capacitor according to claim 2, wherein the upper electrode arranged on the both ends of the dielectric substrate has a notch.

7. The parallel capacitor according to claim 1, wherein a thickness of the both ends of the dielectric substrate is thicker than the thickness of the center portion of the dielectric substrate.

8. The parallel capacitor according to claim 7, wherein an overall thickness of the both ends of the dielectric substrate is thicker than the thickness of the center portion of the dielectric substrate.

9. The parallel capacitor according to claim 7, wherein only the thickness of a portion of the both ends of the dielectric substrate is thicker than the thickness of the center portion of the dielectric substrate.

10. The parallel capacitor according to claim 1, wherein the center portion of the dielectric substrate is formed from a first dielectric material and the both ends of the dielectric substrate includes a second dielectric material, a dielectric constant of the second dielectric material being smaller than the dielectric constant of the first dielectric material.

11. The parallel capacitor according to claim 10, wherein the both ends as a whole of the dielectric substrate are configured by the second dielectric material.

12. The parallel capacitor according to claim 10, wherein only a portion of the both ends of the dielectric substrate is configured by the second dielectric material.

13. A parallel capacitor comprising:
a dielectric substrate including both ends and a center portion between the both ends;
a plurality of upper electrodes provided in a row like in an upper electrode region of a surface of the dielectric substrate, the plurality of upper electrodes being spaced from each other; and
a lower electrode provided on an entire surface of a lower electrode region including a region corresponding to the upper electrode region of an underside of the dielectric substrate, the lower electrode region being wider than the region, wherein
a simultaneous-operation capacity of each capacitors on the both ends is substantially equal to the simultaneous-operation capacity of a capacitor in the center portion, each capacitors on the both ends being configured by the upper electrodes arranged on the both ends of the dielectric substrate, the lower electrode, and the dielectric substrate, and the capacitor in the center portion being configured by the upper electrode arranged in the center portion of the dielectric substrate, the lower electrode, and the dielectric substrate.

14. The parallel capacitor according to claim 13, wherein the simultaneous-operation capacity of the capacitor on the both ends is made substantially equal to the simultaneous-operation capacity of the capacitor in the center portion by making an area of the upper electrode of a capacitor on the both ends smaller than the area of the upper electrode of a capacitor in the center portion.

15. The parallel capacitor according to claim 13, wherein the simultaneous-operation capacity of the capacitor on the both ends is made substantially equal to the simultaneous-operation capacity of the capacitor in the center portion by making a thickness of the dielectric substrate of a capacitor on the both ends thicker than the thickness of the dielectric substrate of a capacitor in the center portion.

16. The parallel capacitor according to claim 13, wherein the simultaneous-operation capacity of the capacitor on the both ends is made substantially equal to the simultaneous-operation capacity of the capacitor in the center portion by configuring the dielectric substrate of a capacitor in the center portion by a first dielectric material and by configuring the dielectric substrate of a capacitor on the both ends such that a second dielectric material whose dielectric constant is smaller than the dielectric constant of the first dielectric material is included.

17. A high frequency semiconductor device comprising:
a field effect transistor chip configured by a plurality of field effect transistor cells;
an input matching circuit connected to the field effect transistor chip and configured by a dividing line and a parallel capacitor; and
an output matching circuit connected to the field effect transistor chip and configured by a combining line and a parallel capacitor, wherein
each of the parallel capacitors including:
a dielectric substrate including both ends and a center portion between the both ends;
a plurality of upper electrodes provided in a row like in an upper electrode region of a surface of the dielectric substrate, the plurality of upper electrodes being spaced from each other; and
a lower electrode provided on an entire surface of a lower electrode region including a region corresponding to the upper electrode region of an underside of the dielectric substrate, the lower electrode region being wider than the region, wherein
a single-operation capacity of each capacitors on the both ends is smaller than the single-operation capacity of a capacitor in the center portion, each capacitors on the both ends being configured by the upper electrodes arranged on the both ends of the dielectric substrate, the lower electrode, and the dielectric substrate, and the capacitor in the center portion being configured by the upper electrode arranged in the center portion of the dielectric substrate, the lower electrode, and the dielectric substrate.

* * * * *